United States Patent [19]

Smith

[11] Patent Number: 4,536,780

[45] Date of Patent: Aug. 20, 1985

[54] SUPERCONDUCTIVE TUNNELING JUNCTION RESISTOR AND METHOD OF FABRICATION

[75] Inventor: Lawrence N. Smith, Lexington, Mass.

[73] Assignee: Sperry Corporation, New York, N.Y.

[21] Appl. No.: 468,603

[22] Filed: Feb. 22, 1983

[51] Int. Cl.³ .................... H01L 39/22; H01L 39/12
[52] U.S. Cl. .......................... 357/5; 357/4; 357/68; 357/71
[58] Field of Search ............... 357/4, 5, 68, 71

[56] References Cited

PUBLICATIONS

Matisoo; J., *Modification of Tunnel Junction Resistance in Josephson Devices*, IBM Technical Disclosure Bulletin, vol. 16, No. 5, Oct. 1973, pp. 1437–1439.

J. C. Villegier & J. C. Veler, Investigation of High Rate Magnetron Sputtering of Niobium Films for Josephson Integrated Circuits, PROC. Applied Superconductivity, Conference, Nov. 30, 1982.

Primary Examiner—Andrew J. James
Assistant Examiner—E. Fallick
Attorney, Agent, or Firm—Howard P. Terry; Arnold L. Albin

[57] ABSTRACT

A superconductive junction device for fabricating Josephson integrated circuits is useful for replacing deposited thin-film resistors. Derived by "poisoning" a superconductive electrode of the Josephson junction, the device displays controllable resistive properties at normal superconducting transition temperatures at substantial savings in the space occupied. Methods of fabricating the device using the selective niobium anodization process and conventional lead alloy processes are disclosed. When both upper and lower superconductive electrodes are poisoned, the device has linear properties whose resistance is identical to the normal resistance of unpoisoned junctions.

21 Claims, 7 Drawing Figures

SUPERCONDUCTIVE TUNNELING JUNCTION RESISTOR AND METHOD OF FABRICATION

BACKGROUND OF THE INVENTION

1. Field of the Invention

The invention relates to superconductive integrated circuits and more particularly to tunneling junctions adapted to replace deposited thin film resistors. The invention is particularly applicable to Josephson integrated circuits with multiple tunneling junctions.

2. Description of the Prior Art

In the manufacture of many integrated circuits, particularly those incorporating Josephson junctions, it is often desirable to form resistive elements by depositing a metallic layer upon an insulating surface. By means of masked etching or lift off processing the desired geometry of the thin film material is obtained. The film material used must exhibit resistive properties when operated at superconducting temperatures. Such materials as gold-indium alloy, copper-germanium alloy, and molybdenum have been used in the prior art.

One problem observed in the prior art is that where the substrate includes steep or re-entrant angles, it is difficult to deposit layers of substantially uniform thickness. Further, for some applications, such as on a power bus, resistance values must conform to the desired critical currents of the Josephson junctions. Where the junction parameters vary over the substrate, adjustment of the resistance values may be desirable. In a multilayer structure, this imposes substantial practical problems and requires additional processing steps. Where relatively high resistance values are required, a thin resistor of extended length is required. Such a resistor may exhibit undesirable inductance, as well as consume appreciable circuit area. Further, undesired parasitic contact resistance may be experienced at the interface between the resistor and superconductive layers.

Since the specific resistance for a given material is fixed, resistance is varied by choosing appropriate lengths and widths over a relatively narrow range of deposit thicknesses. Limitations of choice of suitable resistive materials dictate that substantial areas are required to define values of resistors most commonly used in Josephson junctions, substantially exceeding the dimensions of the junctions themselves. These values may range from less than 0.3 ohm to greater than 30 ohms. In the prior art, for example, a resistor of the order of 30 ohms formed from material with a sheet resistance of 2 ohms/square would require an area of 93.75 $\mu m^2$ compared with a typical junction area of 6.25 $\mu m^2$, representing a ratio of 15:1. For a multiple junction application, as in a 1:2:1 interferometer, for example, a multiplicity of such resistive elements is required, with consequent consumption of chip area.

It is also noted that Josephson logic gates generally have low gain and therefore small operating margins. Resistive elements are a necessary part of these logic gates and as has been noted herein the values of the resistances are difficult to control in fabrication. Nevertheless, close control of such resistance is critical. In general, where the range of resistance values is closely controlled, an active Josephson device will permit correct operation of the gates over a relatively wide possible range of parameters.

Three important parameters of Josephson devices are the critical current $I_c$, normal resistance $R_N$, and the sub-gap resistance $R_S$. The product of $I_c$ and $R_S$ is commonly referred to as $V_m$. The sub-gap resistance $R_S$ is generally not a constant but varies with the applied voltage and is conventionally measured at a particular sub-gap voltage of the order of 1.5–2.0 mV as appropriate for the particular logic gate in which the devices are incorporated. Thus, for example, the sub-gap resistance may be conveniently measured at $V_g2$, where $V_g$ is the gap voltage of the junction. The normal resistance is determined by the slope of the I–V curve above $V_g$. The $I_cR_N$ product and $V_m$ are generally well controlled across a wafer with good control of the fabrication techniques. However, local variations in lithography due to imperfect masks, variations in exposure or photoresist thickness, etc. can change the device area and thereby change $I_c$ and the corresponding values of $R_N$ and $R_S$ across the wafer. Systematic variations may also occur across a wafer because of variations in the barrier thickness. It has been found that such barrier formation variations are present even in the most highly developed formation techniques, which otherwise yield acceptable devices. Such techniques include plasma oxidation and silicon barrier deposition.

Some techniques for altering the electrical properties of Josephson junctions have been previously described, although not for the purpose of fabricating resistive elements. A method for altering the low voltage resistance of a Josephson junction without affecting the zero voltage supercurrent, utilizing a proximity effect structure, was described by J. Matisoo in IBM Technical Disclosure Bulletin V16, No. 5, pp. 1437–39, Oct. 1973. Other techniques have been applied for modifying Josephson junctions in order to increase the yield. For example, indium has been deposited on the counterelectrode, which diffuses through to the tunnel barrier and increases the magnitude of the critical current. An another example, junctions have been annealed to increase critical current. While these methods can be accomplished with the required selectivity, they do not change the essential functionality of the device as a Josephson junction, and are not methods of making resistors from Josephson junctions as described herein.

The introduction of impurities into niobium electrodes as a means of preparing low resistivity resistors has also been suggested in a paper by J. C. Villegier and J. C. Veler, to be published in the Proceedings of the Applied Superconductivity Conference, Nov. 30, 1982.

SUMMARY OF THE INVENTION

The present invention proposes methods for altering a tunnel junction itself to obtain resistive values, while not exceeding the minimal space requirements of a normal superconductive junction.

It has been found that the novel invention described herein permits transforming an active Josephson device into a resistive element whose parameters are closely controlled by those factors which affect the active Josephson device itself. In particular, a thinner barrier produces lower normal resistance $R_N$ and hence beneficially permits higher critical current $I_c$. The methods described herein result in a proportional scaling of active device properties with that of the normal resistance $R_N$. Thus, where both active devices and resistive devices are incorporated on the same wafer, the relative resistance ratio $R_N/R$ will vary proportionately and thereby permit correct operation of a logic gate even though both the normal resistance $R_N$ of an active device and the resistance R of normal resistor device may vary individually across the wafer due to the factors disclosed above.

In accordance with the present invention it has been found that certain resistive elements may be replaced by Josephson junctions, treated to remain in a normal conductive state when operated at superconducting temperatures. In a preferred embodiment the alteration from the superconducting state to the normal state is obtained by impregnating a desired area of a superconductive layer with chemical or magnetic impurities, or by placing a thin non-superconductive metal film in intimate electric contact with the superconductive layer. Such measures have the effect of lowering the superconducting transition temperature of the associated electrode. The affected Josephson junction will thereby exhibit only resistive properties at superconducting temperatures. Typically, the invention comprises a superconductive junction of superposed layers of superconductive material with a barrier layer therebetween, wherein at least one of the superconductive layers has been treated so as to remain in the normal state when the junction is operated at superconducting temperatures, thereby providing a predetermined resistance.

DESCRIPTION OF THE PREFERRED EMBODIMENT

Two general techniques for lowering the superconducting transition temperature of a superconductive film so that it remains in the normal state when exposed to what were heretofore superconducting transition temperatures are the introduction of chemical or magnetic impurities, or if the film is thin in comparison with the coherence length, by placing it in intimate contact with a nonsuperconductive metal film. The coherence length depends on the superconductive material, and is typically of the order of 30–1000 Å but may range as high as 10,000 Å. In the latter instance, the superconducting state is said to be suppressed by the proximity effect. The method chosen for altering the superconducting state of the electrode preferably should have two characteristics: first, it should be capable of being accomplished selectively at specified locations on the circuit; second, it should not change the normal resistance of the tunnel junctions or if it does, such change should be relatively predictable and controllable so that the resistance may conveniently be predetermined by selecting the barrier thickness and geometry.

A preferred embodiment using the selective local anodization technique previously described by H. Kroger in U.S. patent application Ser. No. 179, 311 and assigned to the assignee of the present invention is especially convenient. In this process, a layer of a refractory superconductive material, preferably niobium, 3,000 Å thick, is deposited, followed by formation of the Josephson barrier. The barrier may be formed either by oxidizing the base layer of niobium or by depositing a barrier material, such as hydrogenated silicon. A second layer of superconductive material such as niobium is then deposited over the barrier to a thickness, for example, of 200–600 Å. The resulting structure constitutes a Josephson junction covering the entire substrate area.

In the following discussion, reference is made to S-I-S, S-I-N, and N-I-N junctions. Note that all three junction devices have the same normal resistance, since this is characterized by the tunneling barrier thickness and the device area, but is not a function of the normal or superconducting state of the electrodes.

Figure 1:
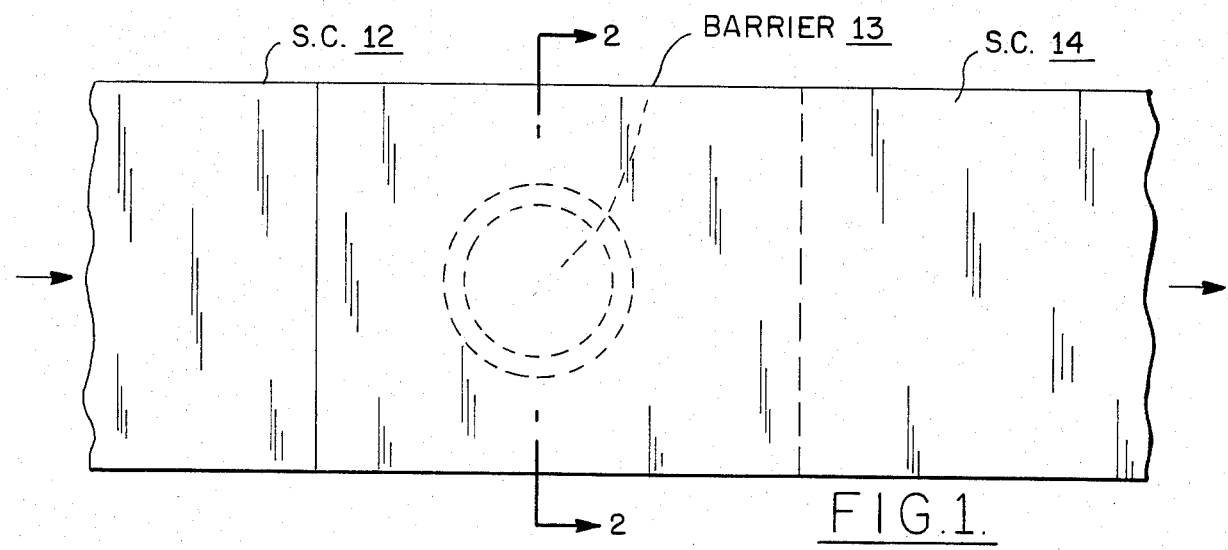
FIG. 1 is a plan view of a superconducting tunnel junction device.
Figure 2:
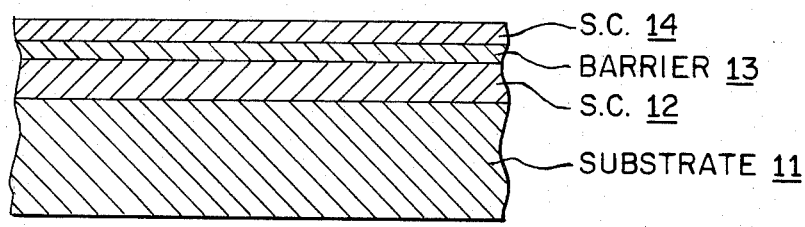
FIG. 2 is a fragmentary cross-section in elevation of the tunnel junction of FIG. 1 taken along lines 2—2, showing the layered structure of the junction.
Figure 3:
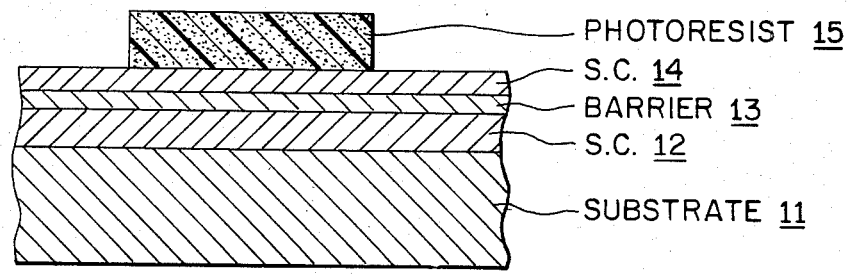
FIG. 3 is the junction of FIG. 2, showing the added step of masking the junction area for anodization.
Figure 4:
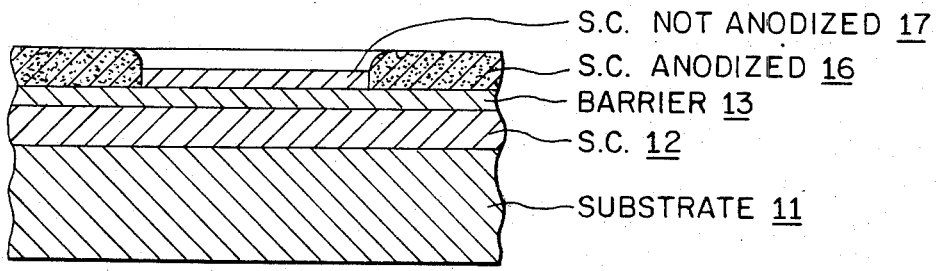
FIG. 4 is the junction of FIG. 3 after anodization and stripping of the mask.

FIG. 1 shows a plan view of a Josephson junction as used in the present invention. A barrier layer 13 is confined between a lower layer 12 of superconductive material and an upper layer 14, also of superconductive material. Referring now to FIG. 2, a substrate 11 which may be a crystalline silicon substrate with an oxidized surface has deposited thereon a thin film of superconductive material 12, with a barrier 13 comprised, for example, of amorphous hydrogenated silicon deposited by RF diode sputtering in a partial hydrogen atmosphere and 300–400 Å in thickness. An upper superconductive layer 14, also preferably of niobium, is next applied, preferably within the same vacuum chamber either by electron beam evaporation or by sputter deposition, to form the second of the two superposed superconductive layers. The superconductive lower layer 12, barrier 13, and upper superconductive layer 14 form a tri-layer structure which may be processed by patterning and anodizing to form individual Josephson junctions. The lower layer 12 forms the Josephson base electrodes and the upper layer 14 forms the Josephson counter-electrodes. The lower layer 12 may also be utilized as the ground plane for the structure. As shown in FIG. 3, individual small area junctions are next defined by forming a photoresist mask 15 over those regions to be utilized as junctions, followed by anodizing the entire upper niobium layer 14 to completion. A thick (3,000 Å) layer of sputtered $SiO_2$ insulator may also be used as a mask. Referring to FIG. 4, the anodized upper superconductive layer 16 is seen to replace completely the upper niobium material 14 by insulation, except where masked at junction 17. When the photoresist mask is removed, it exposes a junction area 17 of the upper superconductive layer which is not anodized. Thus, the junctions for the circuit are defined and the surrounding region is covered by a layer of high quality, pin-hole free insulation all in one step. The resulting structure is called a superconductor-insulator-superconductor structure, abbreviated S-I-S. The modified structures to be described in the present invention are denoted as the superconductor-insulator-normal junction (S-I-N) and the normal-insulator-normal junction (N-I-N).

Figure 7:
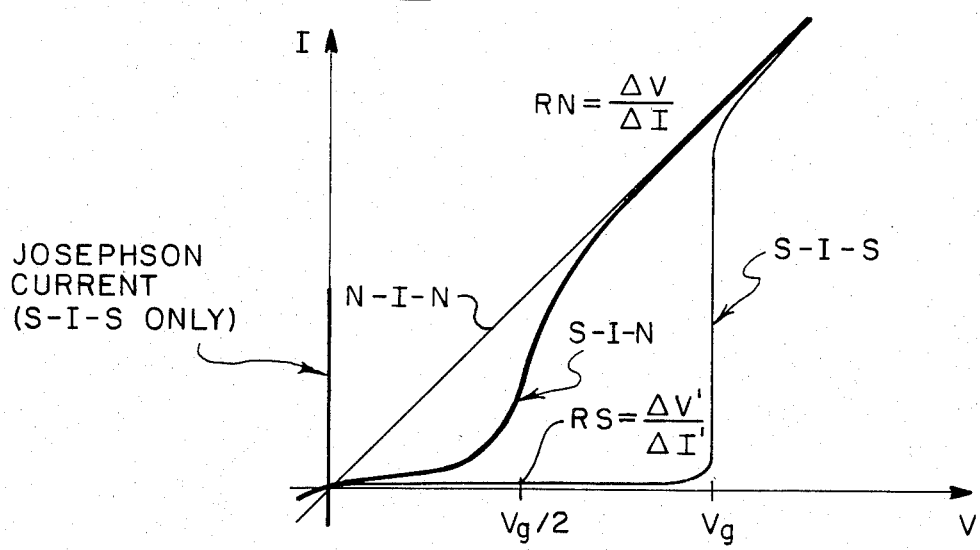
FIG. 7 is a graph of characteristic I-V curves for tunnel junctions, showing the normal resistance of various devices.

FIG. 7 shows characteristic curves of current versus voltage drop (I–V) for the tunnel junction devices disclosed herein. It may be seen that the normal resistance $R_N$ for the S-I-S, S-I-N and N-I-N devices is substantially the same value for all voltages above $V_g$, the sum of the energy gaps. The S-I-N device is seen to be highly non-linear in the region of $V_g/2$, while the N-I-N device is quite linear throughout the useful Josephson current range. Note the non-linear resistance change for the S-I-N characteristics at voltages below the sum of the energy gaps $V_g$, and the gradual slope of increase in current I, rather than the abrupt change observed with an S-I-S device, at $V_g$. Note also that both the resistance R of the S-I-N or N-I-N devices and the resistance $R_N$ of the S-I-S devices will be determined by junction area and barrier thickness.

Beneficially, the fabrication techniques of the present invention permit selectively altering one or both junction electrodes in a plurality of regions to provide junctions which have well defined resistive characteristics at normal superconducting transition temperatures.

Figure 5:
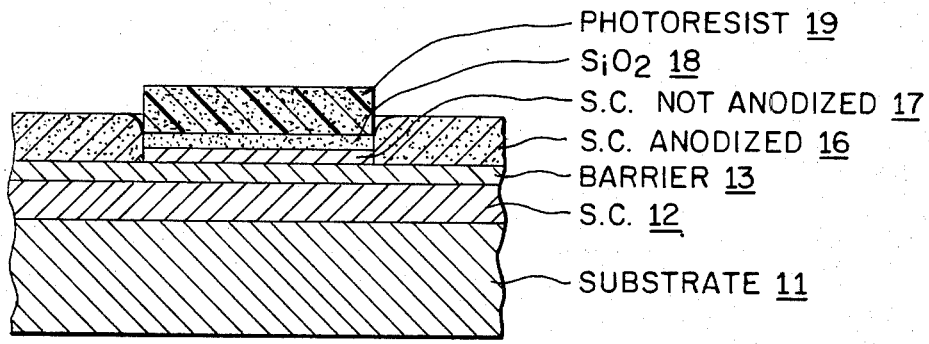
FIG. 5 is a cross-section of a tunnel junction device, showing a preferred method of forming an S-I-S junction, using the selective anodization process and thin insulating layer of the present invention, also taken along line 2—2 of FIG. 4.

Referring now to FIG. 5, there is shown one method of altering the upper superconductive layer so that it remains in a normal resistive state at the transition temperature typically associated with this material. Prior to anodization a thin (approximately 300 Å) layer 18 of silicon dioxide ($SiO_2$) is deposited over the trilayer. A photoresist mask 19 is then applied over the $SiO_2$ layer at the junction locations and the pattern transferred to the $SiO_2$ layer by subtractive etching. It has been found that with both the $SiO_2$ and the resist in combination blocking the junction area during the anodization, high quality S-I-S devices are obtained.

Figure 6:
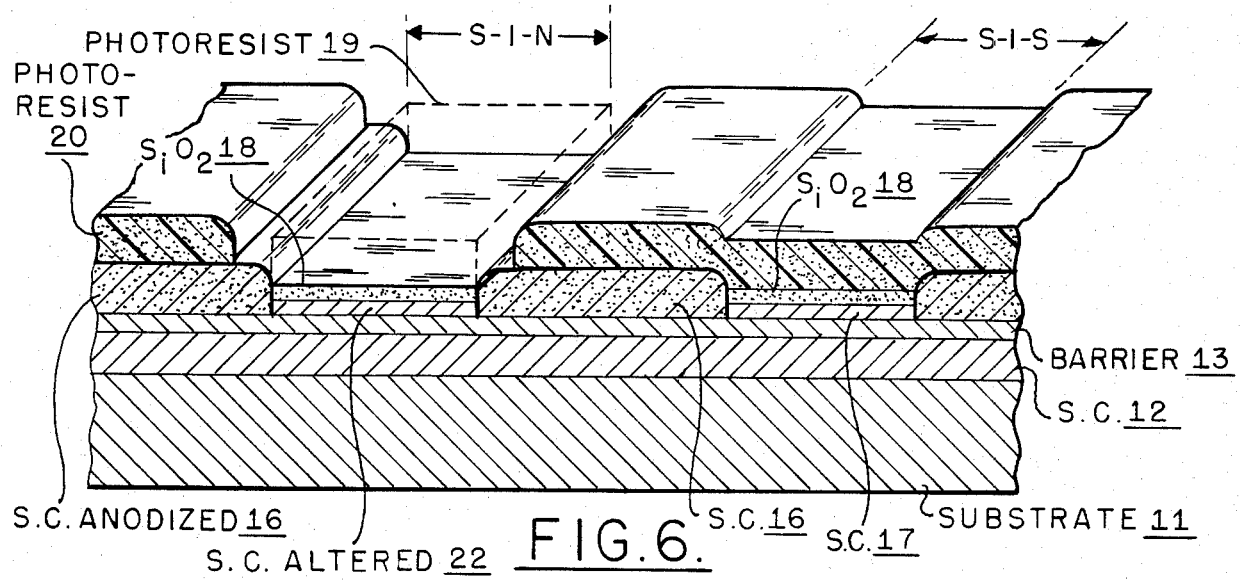
FIG. 6 is a cross-section of a multijunction device, similar to FIG. 5, useful in understanding the formation of S-I-N and S-I-S junctions.

Referring now to FIG. 6, the mask 19 is stripped off and a new photoresist mask 20 is now applied, patterned with vias in the area intended for S-I-N devices and again anodized, with an applied voltage equal to the final voltage in the previous anodization step. The S-I-N junction area exposed to anodization and protected only by the extremely thin $SiO_2$ layer will be altered or "poisoned" by the anodization process as shown at SC22, while the previously anodized regions SC16 and SC17 will be substantially unaffected. The photoresist mask 20 is then stripped off, and contact may be made to the underlying superconductive layers by etching vias through a mask followed by metal deposition in the usual fashion.

Another approach for selectively defining junction areas to be poisoned during the anodization process is to apply a second heavier insulating layer such as SiO above the thin $SiO_2$ layer in areas intended to form active Josephson devices. The second layer can be independently patterned to protect the underlying superconductive material while exposing the underlying $SIO_2$ layer during the process of formation of junction areas. After anodization, the SiO in the region of the S-I-S junction is then differentially etched away to allow contact by a terminal deposited thereon. This is particularly useful if a process other than anodization, such as thermal oxidation, is used for the isolation of the junctions.

In order to obtain N-I-N junctions, which provide desirable linearity of the resistive junctions, it is also necessary to poison the lower electrode. One method by which this may be achieved is to deposit and pattern a non-superconductive layer beneath the base electrode. If the base electrode is made sufficiently thin, of the order of the coherence length, it will be altered by the proximity affect. Alternatively, by introducing chemical impurities into the lower layer, such as by masking the junction areas and exposing to hydrogen, thereby forming, for example, niobium hydride, the base electrode properties will also be favorably altered. Other chemical or magnetic impurities could also be introduced directly into the base electrode. It is also believed that an intentional change in the crystalline structure of the electrode during deposition could lower the superconducting transition temperature of the electrode.

Chemical diffusion through a mask by any of the conventional processes is also feasible. The latter processes undesirably require resist mask processing on the surface adjacent to the tunnel barrier, which is avoided in the selective niobium anodization process, and hence will require some process such as sputter cleaning before the barrier is formed. It is believed that this method should not affect the tunnel barrier formation or its properties, however.

While not limited to circuits fabricated with the selective niobium anodization process (SNAP), the process is particularly adapted to SNAP because it is relatively easy to alter the transition temperature of niobium as has been demonstrated in the construction of S-I-N devices. It should be noted that the S-I-N device is useful in some applications, but because its resistance is non-linear as a function of the applied voltage, it cannot be used to replace an ideal resistor. However, the N-I-N structure should be useful to replace substantially all thin film resistors in a Josephson integrated logic circuit. Beneficially, such an application provides the following advantages: (1) resistance values may be predetermined by the area of the junction and thickness of the barrier, (2) in selected circuit applications such as power supply feed resistors, variations in critical current from a desired nominal value for the Josephson junction will be exactly compensated by the corresponding variation in the resistive junction value, (3) in some applications junction resistors will consume less circuit area than the corresponding film resistors (not necessarily true for very low value resistors), (4) parasitic contact resistance between the resistor junction and superconducting layers is eliminated because contact is made by the zero-resistance Josephson electrodes in the same step as the zero-resistance contact to the active devices.

While the invention described herein has discussed niobium electrodes because of their adaptability to the SNAP process, such usage is exemplary only, and the methods herein are adaptable to conventional processes and non-refractory superconductive metals, such as lead alloys. It is also noted that the drawings herein have been exaggerated in details of scale for clarity in presentation, and do not represent the true dimensions of the devices shown.

While the invention has been described in its preferred embodiments, it is to be understood that the words which have been used are words of description rather than of limitation and that changes within the purview of the appended claims may be made without departing from the true scope and spirit of the invention in its broader aspects.

I claim:

1. A junction device comprising:
   (a) a substrate,
   (b) a base layer of non-superconductive material,
   (c) a first layer of superconductive material, characterized by a superconducting transition temperature and having a thickness substantially less than the coherence length of said material, (d) a second layer of superconductive material, superposed with respect to said first layer, and also characterized by a superconducting transition temperature, and (e) a barrier between said first and second layers for conducting tunneling current therebetween, (f) said base layer deposited in at least one limited region so that said region remains in a substantially normal state and said junction device has a predetermined resistance when cooled to said superconducting transition temperature of said superconductive layer.

2. A junction device as set forth in claim 1 wherein said means for lowering said superconducting transition temperature comprises chemical impurities implanted into at least said one of said superconductive layers.

3. A junction device as set forth in claim 2 wherein said chemical impurities comprise products of an anodization electrolyte transferred through an insulating film of predetermined thickness to said one of said superconductive layers.

4. A junction device as set forth in claim 2, wherein said chemical impurities comprise chemical vapors diffused through an overlaying mask in said limited region.

5. A junction device as set forth in claim 1, wherein said means for lowering said superconducting transition temperature comprises hydrogenation in said limited region of at least one of said first and second layers of superconductive material.

6. A junction device as set forth in claim 1, wherein said means for lowering said superconductive temperature comprises magnetic impurities implanted into said one of said superconductive layers.

7. A junction device as set forth in claim 1, comprised of superconductor-insulator-normal layers of material.

8. A junction device as set forth in claim 7, wherein said predetermined resistance varies non-linearly with applied voltage.

9. A junction device as set forth in claim 1 comprising normal-insulator-normal layers of materials.

10. A junction device as set forth in claim 9 wherein said predetermined resistance is constant over a range of applied voltage.

11. A junction device as set forth in claim 1 wherein said predetermined resistance of said further tunnel junction is characterized by the normal resistance of said associated superconductor-insulator-superconductor junction tunnel.

12. The junction device as described in claim 1 wherein at least one of said first and second layers of superconductive materials is selected from the group consisting of niobium and niobium nitride.

13. In a junction device as set forth in claim 1, a substrate and a base layer of non-superconductive material between said substrate and said first layer of superconductive material, said first layer having a thickness substantially less than the coherence length of said superconductive material.

14. A junction device as set forth in claim 4 wherein said chemical vapors consist of a gas selected from the group consisting of oxygen and hydrogen, and at least one of said first and second superconductive layers is comprised of niobium.

15. A junction device comprising in combination:

(a) a superconductor-insulator-superconductor (S-I-S) tunnel junction comprised of first and second layers of superconductive material having a superconducting transition temperature and separated by a tunneling barrier layer, said junction exhibiting superconductive properties including a subgap resistance when cooled to said transition temperature and a normal resistance at temperatures exceeding said transition temperature; and (b) a further tunnel junction associated with said S-I-S tunnel junction, comprised of said first and second layers of superconductive material and said barrier layer, said further tunnel junction including means for lowering said superconducting transition temperature of at least one of said superconductive layers in at least one limited region, so that said further junction exhibits a normal resistance when operative at said superconducting transition temperature, said normal resistance varying proportionately with said barrier layer thickness and an area defining said further junction.

16. A junction device comprising:

(a) a first layer of superconductive material, characterized by a superconducting transition temperature, (b) a second layer of superconductive material, superposed with respect to said first layer, and also characterized by a superconducting transition temperature, (c) a barrier between said first and second layers for conducting tunneling current therebetween, and (d) an insulating layer of predetermined thickness deposited on said second layer, patterned for receiving chemical impurities implanted in a limit region of said second layer, and adapted for lowering the superconducting transition temperature of said second layer in said limited region so that said region remains in a normal state and said junction device has a predetermined resistance when cooled to said superconducting transition temperature of said second layer.

17. A junction device as set forth in claim 16 wherein said chemical impurities comprise products of an anodization electrolyte transferred through a film of $SiO_2$.

18. A junction device as set forth in claim 16, wherein said chemical impurities comprise chemical vapors diffused through an overlaying mask.

19. The junction device as described in claim 16, wherein at least one of said first and second layers of superconductive materials is selected from the group consisting of niobium and niobium nitride.

20. The junction device as set forth in claim 19, wherein said insulating layer comprises an oxide of silicon.

21. The junction device as set forth in claim 20, further comprising a base layer of normal material underlying said first layer and in contact therewith, said base layer having a thickness of about 100Å.

* * * * *